United States Patent [19]
Pant et al.

[11] Patent Number: 6,091,271
[45] Date of Patent: Jul. 18, 2000

[54] FREQUENCY DOUBLING METHOD AND APPARATUS

[75] Inventors: Sandeep Pant, Whitehall; Scott A. Segan, Allentown, both of Pa.

[73] Assignee: Lucent Technologies, Inc., Murray Hill, N.J.

[21] Appl. No.: 09/107,481

[22] Filed: Jun. 30, 1998

[51] Int. Cl.[7] .................................................. H03B 19/00
[52] U.S. Cl. ............................................ 327/122; 327/119
[58] Field of Search .................................. 327/113, 116, 327/119, 120, 122, 172, 291

[56] References Cited

U.S. PATENT DOCUMENTS

| | | | |
|---|---|---|---|
| 4,101,789 | 7/1978 | Ruhmau | 327/119 |
| 4,634,987 | 1/1987 | Nolte | 327/122 |
| 5,635,866 | 6/1997 | Monk et al. | 327/122 |

*Primary Examiner*—Jung Ho Kim

[57] ABSTRACT

The frequency doubling circuit according to the present invention includes first and second pulse generating circuits generating first and second pulse trains based on a periodic input signal. The second pulse train is out of phase with the first pulse train, and a combining circuit combines the first and second pulse trains to generate a periodic output signal having twice the frequency of the periodic input signal. Both the first and second pulse generating circuits include first and second charge storage devices, with the second charge storage device having half the storage capacity of the first charge storage device.

27 Claims, 4 Drawing Sheets

PULSE

NAND GATE 54

NOR GATE 22

PULSE FROM
SECOND PULSE
GEN. CKT. 14

INVERTER 18

FREQUENCY DOUBLING METHOD AND APPARATUS

BACKGROUND OF THE INVENTION

1. Field of the Invention

The present invention relates to a method and apparatus for doubling the frequency of a periodic input signal.

2. Description of Related Art

Integrated circuits often utilize an external clock source such as a crystal oscillator. To reduce the cost of such circuits, it is desirable to use lower frequency crystals, and to multiply the frequency produced by these crystal oscillators on chip.

Known frequency doubling circuits use phased-locked loops, but these are large and complex circuits. A simpler alternative would be to use a circuit that produces pulses off both the rising and falling edges of an incoming clock signal to double the frequency of the incoming clock signal. Unfortunately, however, such a circuit produces pulses with widths that vary greatly based on the applied voltage, circuit fabrication process and operating temperature.

SUMMARY OF THE INVENTION

The frequency doubling circuit according to the present invention includes first and second pulse generating circuits generating first and second pulse trains based on a periodic input signal. The second pulse train is out of phase with the first pulse train, and a combining circuit combines the first and second pulse trains to generate a periodic output signal having twice the frequency of the periodic input signal. Both the first and second pulse generating circuits charge first and second charge storage devices, with the second charge storage device having half the storage capacity of the first charge storage device. Based on a comparison of the voltages stored by the first and second charge storage devices, the pulse generating circuit generates the respective pulse train. By generating pulses based on the charging of the first and second charge storage devices, the frequency doubling circuit is substantially insensitive to external influences.

BRIEF DESCRIPTION OF THE DRAWINGS

The present invention will become more fully understood from the detailed description given here-in-below and the accompanying drawings which are given by way of illustration only, wherein like reference numerals designate corresponding parts in the various drawings, and wherein.

DETAILED DESCRIPTION OF THE PREFERRED EMBODIMENTS

Figure 1:
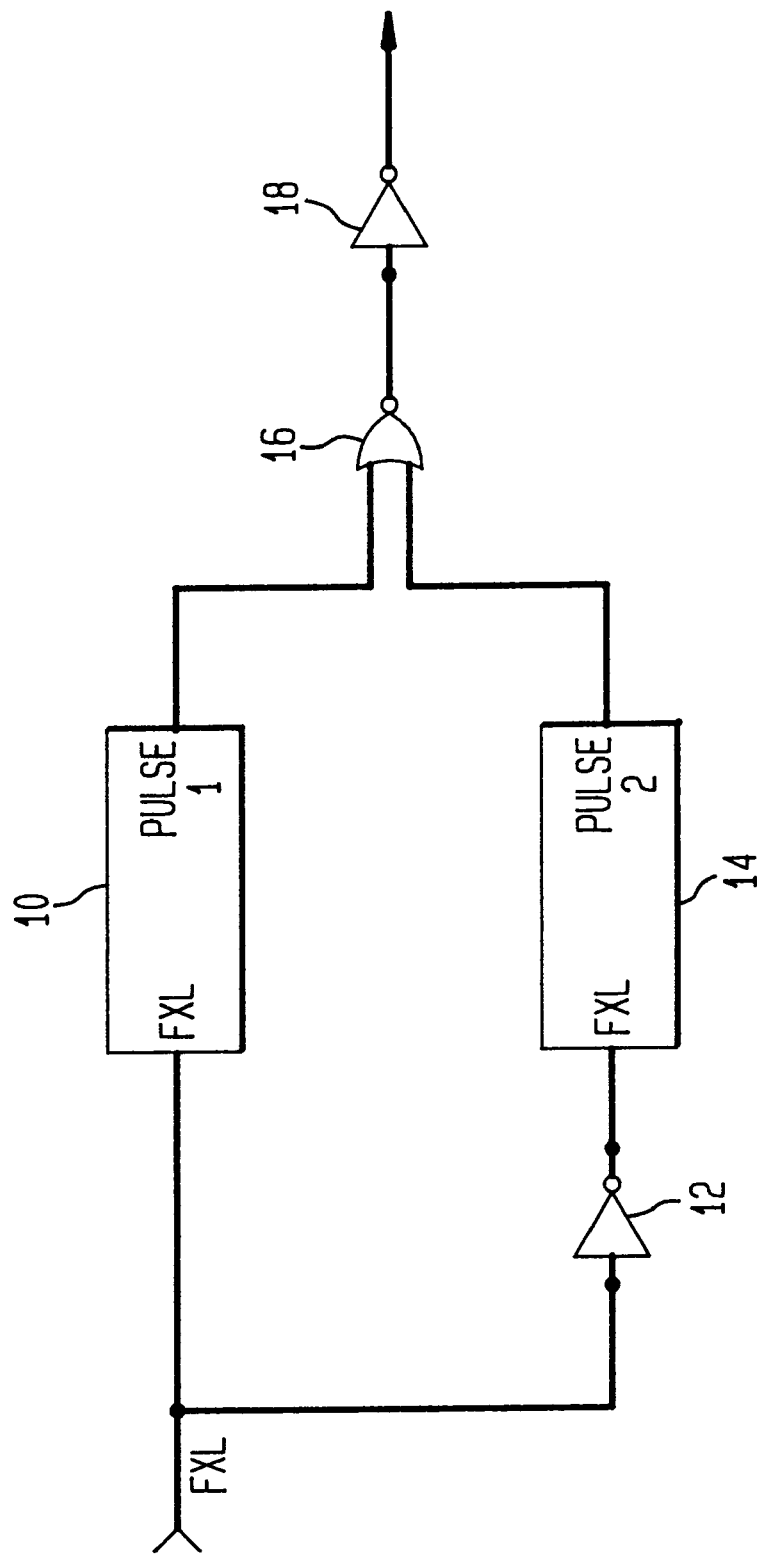
FIG. 1 illustrates an embodiment of the frequency doubling circuit according to the present invention.

The following detailed description relates to an integrated circuit including a frequency doubling circuit according to the present invention. FIG. 1 illustrates an embodiment of the frequency doubling circuit according to the present invention. As shown, a first pulse generating circuit 10 receives a periodic digital input signal. For the purposes of discussion only, the periodic digital input signal will be described as a clock signal FXL. The clock signal FXL is generated by, for instance, a crystal oscillator (not shown).

A first inverter 12 inverts the clock signal FXL, and applies the inverted clock signal to the periodic digital signal input of a second pulse generating circuit 14.

As shown in FIG. 1, a first NOR gate 16 receives the output pulses from the first and second pulse generating circuits 10 and 14. The output of the first NOR gate 16 is, optionally, applied to a second inverter 18, and together, the first NOR gate 16 and the second inverter 18 implements an OR gate function.

Figure 3A:
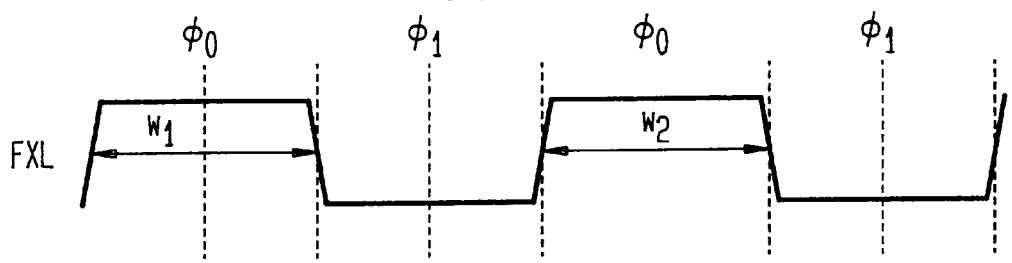
FIGS. 3A–3I illustrate waveforms generated by the circuit elements of FIGS. 1 and 2.
Figure 3B:
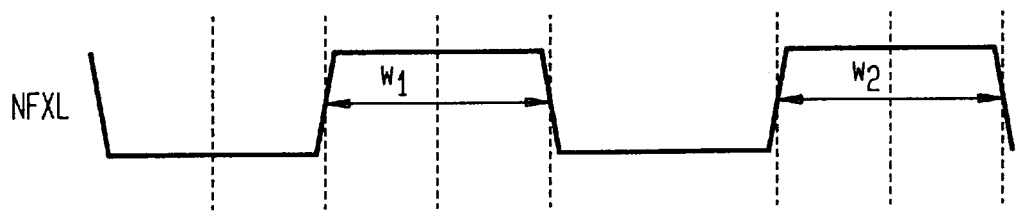
Figure 3C:
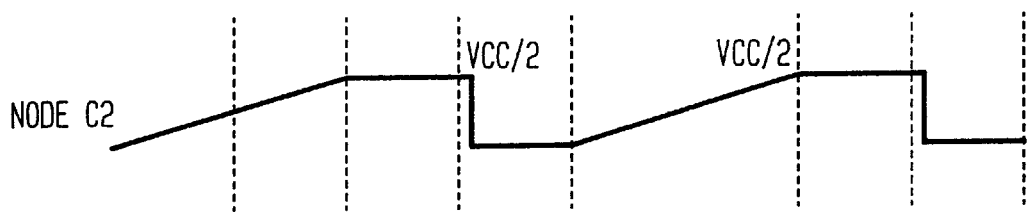
Figure 3D:
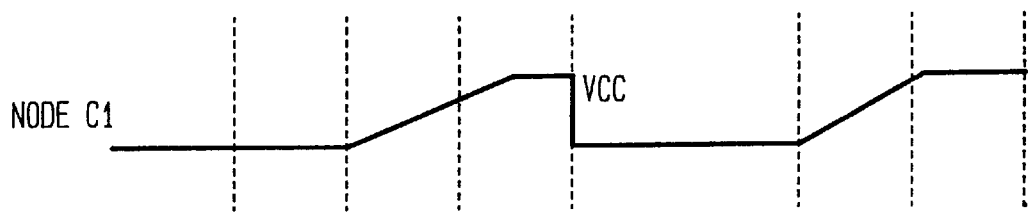
Figure 3E:
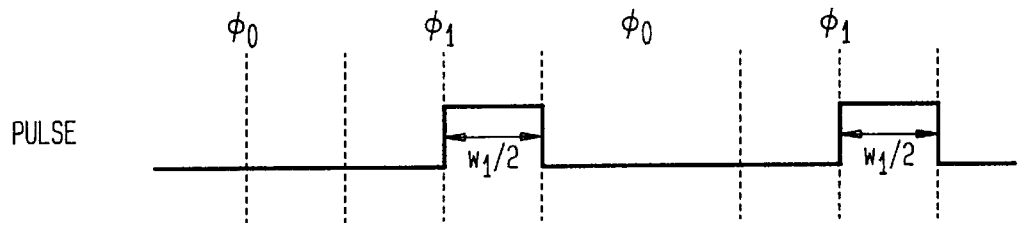
Figure 3F:
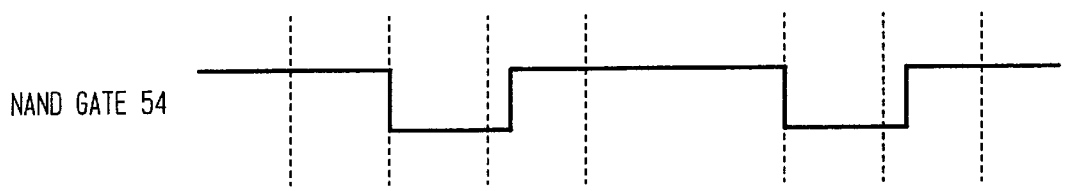
Figure 3G:
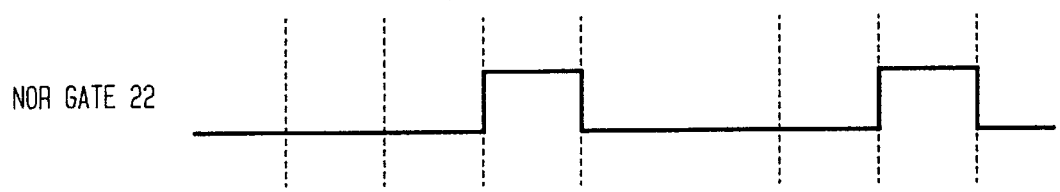
Figure 3H:
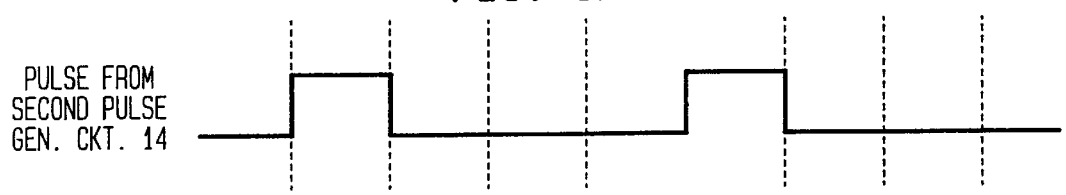

The first pulse generating circuit 10, as shown in FIG. 3E, generates pulses having half the pulse width of the pulses in the clock signal FXL, but at the same frequency. The second pulse generating circuit 14 has the same structure as the first pulse generating circuit 10. The second pulse generating circuit 14, however, receives the inverted clock signal NFXL instead of the clock signal FXL. The second pulse generating circuit 14, therefore, generates pulses having half the pulse width of the pulses in the inverted clock signal, but at the same frequency, as shown in FIG. 3H. Accordingly, the pulses generated by the second pulse generating circuit 14 are 180 degrees out of phase with the pulses generated by the first pulse generating circuit 10.

Figure 3I:
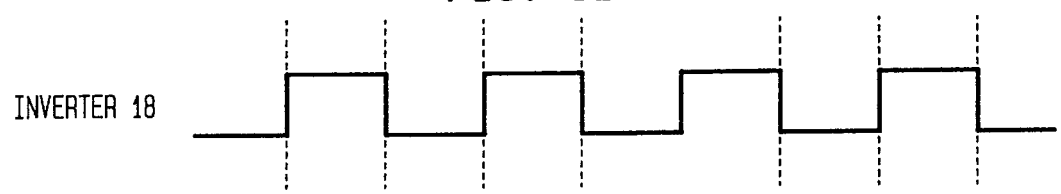

The first NOR gate 16 functions to combine the output signals from the first and second pulse generating circuits 10 and 14. The first inverter 18 functions to invert the output of the first NOR gate 16. Hence, the inverter 18 generates pulses for the duration of pulses output from either the first or second pulse generating circuit 10 and 14, and generates no pulses when no pulses are output from either the first or second pulse generating circuits 10 and 14. FIG. 3I illustrates the output of the first inverter 18.

Figure 2:
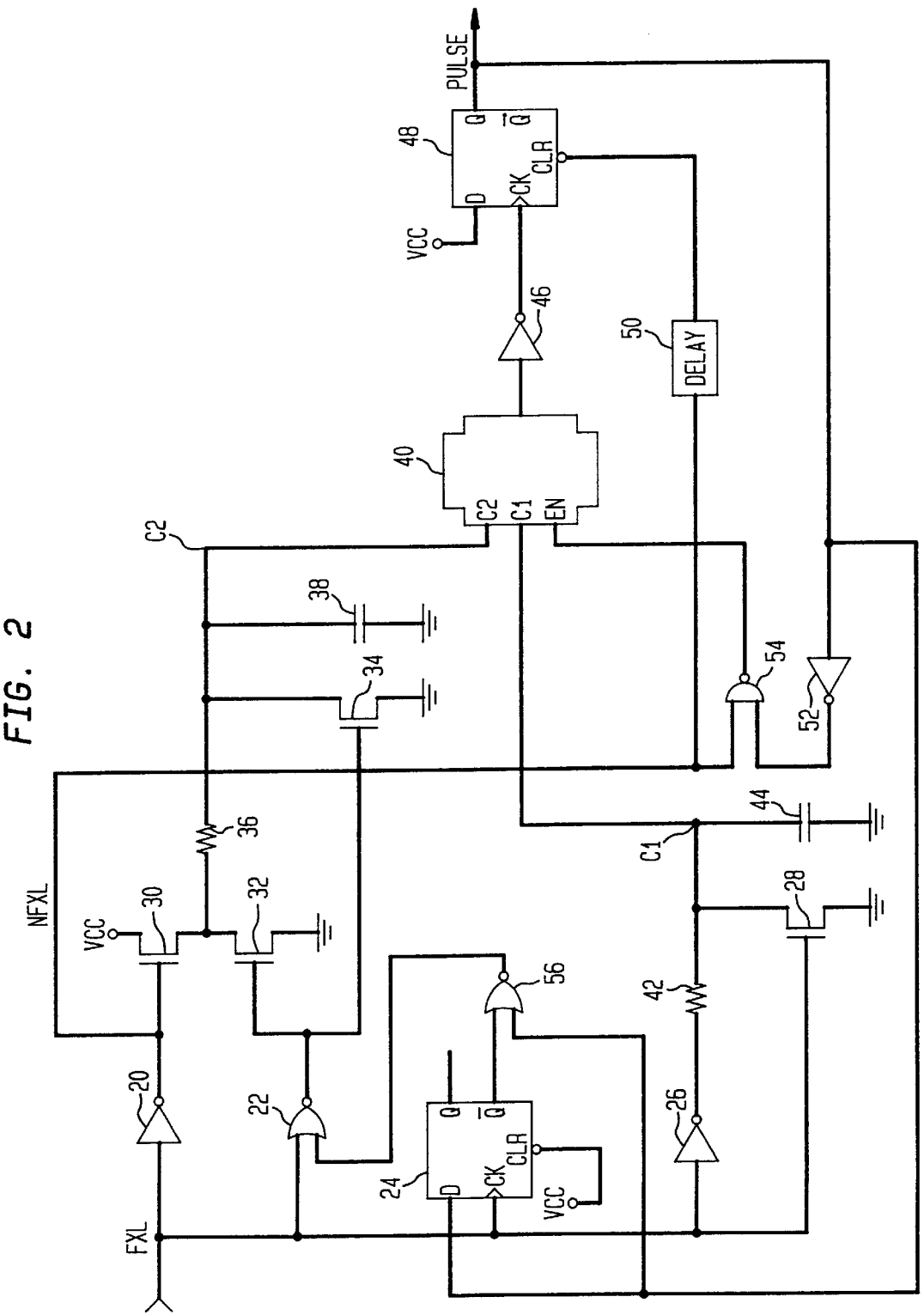
FIG. 2 illustrates a pulse generating circuit in the frequency doubling circuit of FIG. 1.

Next, the structure and operation of the first pulse generating circuit 10 will be described. Because the structure and operation of the second pulse generating circuit 14 is the same as the first pulse generating circuit 10, the structure and operation of the second pulse generating circuit 14 will not be described. FIG. 2 illustrates the first pulse generating circuit 10 in detail.

As shown in FIG. 2, the clock signal FXL is supplied to a third inverter 20, a second NOR gate 22, the clock input of a first D-type flip-flop (D-FF) 24, a fourth inverter 26, and the gate of a first N-MOS transistor 28. The output of the third inverter 20 is applied to the gate of a P-MOS transistor 30. The P-MOS transistor 30 and a second N-MOS transistor 32 are connected in series between a power source voltage VCC and ground.

A first resistor 36 is connected to the junction between the P-MOS transistor 30 and the second N-MOS transistor 32. A third N-MOS transistor 34 and a first capacitor 38 are connected in parallel between the first resistor 36 and ground.

A second resistor 42 is connected to the output of the fourth inverter 26, and the first N-MOS transistor 28 and a second capacitor 44 are connected in parallel between the second resister 42 and ground. The point of connection between the second resistor 42, the first N-MOS transistor 28 and the second capacitor 44 will be referred to as the first node C1. Furthermore, the point of connection between the first resistor 36, the third N-MOS transistor 34 and the first capacitor 38 will be referred to as the second node C2.

A comparator 40 compares the voltages at the first and second nodes C1 and C2, and the output of the comparator 40 is inverted by a fifth inverter 46. The output of the fifth inverter 46 serves as the clock signal for a second D-FF 48. A delay element 50 delays the inverted clock signal NFXL output by the third inverter 20, and the output of the delay element 50 serves as the clear signal for the second D-FF 48. The input of the second D-FF 48 is connected to the power source voltage VCC, and the output of the second D-FF 48 serves as the output of the first pulse generating circuit 10.

The output of the second D-FF 48 is fed back to the input of the first D-FF 24, a sixth inverter 52, and a third NOR gate 56. A NAND gate 54 receives both the output of the sixth inverter 52 and the inverted clock signal NFXL output from the third inverter 20, and generates an enable signal, which is applied to the comparator 40. The clear input of the first D-FF 24 is connected to the power source voltage VCC, and the inverted output of the first D-FF 24 is connected to the third NOR gate 56. The output of the third NOR gate 56 and the clock signal FXL are supplied to the second NOR gate 22, and the output of the second NOR gate 22 is connected to the gates of the second and third N-MOS transistors 32 and 34.

The operation of the first pulse generating circuit 10 illustrated in FIG. 2 will now be described with reference to FIGS. 3A–3G. FIG. 3A illustrates the clock signal FXL, and as shown in FIG. 3A, the clock signal FXL substantially includes equal periods of high and low. The third inverter 20 inverts the clock signal FXL to produce the inverted clock signal NFXL shown in FIG. 3B.

When the clock signal FXL goes high, the inverted clock signal NFXL goes low. Because the gate of the P-MOS transistor 30 receives the inverted clock signal NFXL, the P-MOS transistor 30 turns on. Also, with the clock signal FXL going high, the second NOR gate 22 outputs a logic low signal, and the second and third N-MOS transistors 32 and 34 are, therefore, off. With the P-MOS transistor 30 on and the second and third N-MOS transistors 32 and 34 off, the power source voltage VCC is substantially applied to the junction between the P-MOS transistor 30 and the second N-MOS transistor 32. The first capacitor 38 begins charging. FIG. 3C illustrates the voltage at the second node C2.

The first capacitor 38 charges for the duration that the clock signal FXL remains high. When the clock signal FXL goes low, the P-MOS transistor 30 turns off, and the first capacitor 38 maintains the charge at the second node C2. The first resistor 36 and the first capacitor 38 form a resistor-capacitor network, and the resistance and capacitance thereof, have been chosen such that the charge at the second node C2 rises slowly and does not exceed half the power source voltage VCC/2 during normal operation. Furthermore, the resistance of the first resistor 36 is set sufficiently high to minimize variations in the charge stored by the first capacitor 38 caused by changes in the conductance of the P-MOS transistor 30 due to processing and temperature variations.

Also, when the clock signal FXL goes high, the first N-MOS transistor 28 turns on and discharges the first node C1 to ground. Accordingly, the second node voltage received by the comparator 40 is greater than the first node voltage. However, when the clock signal FXL goes low, the first N-MOS transistor 28 turns off, and the output of the fourth inverter 26 goes high. The second capacitor 44 begins charging via the second resistor 42. The resistance of the second resistor 42 is set substantially equal to the resistance of the first resistor 36, but the capacitance of the second capacitor 44 is approximately half the capacitance of the first capacitor 38. Hence, as shown in FIG. 3D, the voltage at the first node C1 rises twice as fast as the voltage at the second node C2. Furthermore, the resistance of the first and second resistors 36 and 42 and the capacitances of the first and second capacitors 38 and 44 have been chosen such that the time period for the voltage at the first node C1 to reach the voltage maintained at the second node C2 equals half the pulse width of a pulse in the clock signal FXL.

Instead of capacitors, any charge storage devices, such as sample and hold circuit, can be used.

When enabled, the comparator 40 generates a logic high output when the voltage at the second node C2 is greater than the voltage at the first node C1, and generates a logic low output when the voltage at the second node C2 is less than the voltage at the first node C1. When disabled, the comparator 40 generates a logic high. The fifth inverter 46 inverts the output of the comparator 40, and supplies the inverted output of the comparator 40 to the clock input of the second D-FF 48. The delay element 50 delays the inverted clock signal NFXL output from the third inverter 20, and supplies the delayed, inverted clock signal NFXL to the reset or clear input of the second D-FF 48. The delay period of the delay element 50 is set equal to the processing time of the comparator 40 and the fifth inverter 46. The second D-FF 48 resets or clears the value stored therein to zero when a logic low signal is received at the reset input. Accordingly, the second D-FF 48 outputs a logic low signal when the clock signal FXL is high.

When the clock signal FXL goes low and after the delay time through the delay element 50, the D-FF 48 is no longer reset. Instead, the second D-FF 48 stores and outputs the power source voltage VCC at the rising edge of a signal received at its clock input. The second D-FF 48 is only clocked when the output of the fifth inverter 46 transitions from low to high, and the output from the fifth inverter 46 only transitions from low to high when the output of the comparator 40 transitions from high to low. As discussed above, when the clock signal FXL is high the voltage at the second node C2 is greater than the voltage at the first node C1, and the output of the comparator 40 is high.

Also, when the clock signal FXL goes low, the voltage at the second node C2 remains greater than the voltage at the first node C1 for a period of time equal to half the pulse width of a pulse in the clock signal FXL (see FIGS. 3C and 3D and the discussion above). When the voltage at the first node C1 exceeds the voltage at the second node C2, however, the output of the comparator 40 goes low, and the output of the second D-FF 48, therefore, goes high. The output of the second D-FF 48 serves as the output of the first pulse generating circuit 10, and is illustrated in FIG. 3E. When the clock signal FXL goes high again, the second D-FF 48 goes low again. As shown in FIGS. 3A, 3B and 3E, the output pulse of the first pulse generating circuit 10 has half the pulse width of the previous pulse in the clock signal FXL, and is generated at the same frequency as the pulses in the clock signal FXL, albeit with a phase shift.

Additionally, first and second nodes C1 and C2 must be discharged to ground during their inactive phases. As described earlier, when the second node C2 is charging (FXL is logic high), the first node C1 is discharged via the first N-MOS transistor 28. Once the output from the second D-FF 48 goes high, the second node C2 can be discharged. This is accomplished by the second and third NOR gates 22 and 56. When the output of the second D-FF 48 goes high, the output of the third NOR gate 56 goes low, and, as shown in FIGS. 3A and 3E, the clock signal FXL is low. The second NOR gate 22, which receives both the clock signal FXL and the output of the third NOR gate 56, then outputs a logic high signal. When the output of the second NOR gate 22 goes high, the second N-MOS transistor 32 and the third N-MOS transistor 34 turn on and discharge the second node C2.

The first pulse generating circuit 10 also includes means for reducing power consumption. Namely, the first pulse generating circuit 10 includes the NAND gate 54, which controls whether the comparator 40 is enabled. As discussed above, the second D-FF 48 outputs a logic low when the clock signal FXL is high regardless of the output of the comparator 40, and the second D-FF 48 is clocked when the clock signal FXL is low and the output of the comparator 40 transitions from high to low. As a result, the comparator 40 does not need to be enabled while the clock signal FXL is high or after the output of the second D-FF 48 goes high.

The NAND gate 54 receives the inverted clock signal FXL output from the third inverter 20, and the inverted output of the second D-FF 48 from the sixth inverter 52. As shown in FIG. 3F, the NAND gate 54 only generates a logic low signal and enables the comparator 40 when the clock signal FXL is low and the output from the second D-FF 48 is low. Consequently, the comparator 40 is not enabled when the clock signal FXL is high or after the output of the second D-FF 48 goes high, and does not draw power while disabled.

As discussed above, the first and second nodes C1 and C2 must be discharged during their inactive phases. However, if for some reason, such as during power up, the second node C2 charges to the power source voltage VCC, the voltage at the first node C1 will not exceed the voltage at the second node C2, and the output of the comparator 40 will not transition from high to low. To prevent this trapped state, the first D-FF 24 has been provided.

The first D-FF 24 stores the value at its input (i.e., the output from the second D-FF 48), and outputs the inverse of the stored value to the third NOR gate 56 when the clock signal FXL transitions from low to high. Under normal operating conditions, as shown in FIG. 3A and 3E, the output of the second D-FF 48 will always be high at that instant. As a result, the inverted output from first D-FF 24 goes low, and the third NOR gate 56, which receives the inverted output of the first D-FF 24 and the output of the second D-FF 48, goes low. As shown in FIG. 3G, the output of the second NOR gate 22, which receives the output of the third NOR gate 56, goes low, and the second and third N-MOS transistor 32 and 34 are turned off. As discussed above, immediately after the start of the next pulse output from the second D-FF 48, the output of the second NOR gate 22 goes high again, and the second and third N-MOS transistors 32 and 34 turn on to discharge the second node C2.

During the trapped state, the output of the second D-FF 48 will be low when the clock signal FXL transitions from low to high. As a result, the inverted output from the first D-FF 24 goes high. Because the inverted output from the first D-FF 24 is high, the output from the third NOR gate 56 goes low. With the output from the third NOR gate 56 low, the output from the second NOR gate 22 goes high when the clock signal FXL goes low. When the output of the second NOR gate 22 goes high, the second N-MOS transistor 32 and the third N-MOS transistor 34 turn on and discharge the second node C2, and normal operation commences on subsequent cycles.

The frequency doubling circuit according to the present invention produces pulse widths which do not vary with the applied voltage, circuit fabrication process and operating temperatures. By generating pulses based on the ratio between two charge storage devices, the frequency doubling circuit according to the present invention has been rendered substantially insensitive to such external influences.

Furthermore, it will be understood by one skilled in the art that the frequency of a periodic input signal can increased by factors of two by concatenating frequency doubling circuits according to the present invention.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An integrated circuit including a frequency doubling circuit, comprising:

a first pulse generating circuit generating a first pulse train based on a periodic input signal; and a second pulse generating circuit generating a second pulse train based on said input signal, said second pulse train being out of phase with said first pulse train;

a combining circuit combining the first and second pulse trains to produce a periodic output signal having a frequency twice a frequency of said period input signal; and wherein said first and second pulse generating circuits each include first and second charge storage devices with the second charge storage device having half a storage capacity of said first storage device.

2. The integrated circuit of claim 1, wherein said first and second pulse generating circuit comprise:

a first charging circuit for charging said first charge storage device when said periodic input signal is a first logic state;

a second charging circuit for charging said second charge storage device when said period input signal is a second logic state;

a comparator comparing a first voltage stored by said first charge storage device to a second voltage stored by said second charge storage device; and a pulse generator generating an output pulse having a pulse width half a pulse width of an input pulse in said periodic input signal based on output from said comparator.

3. The integrated circuit of claim 2, wherein said pulse generator generates said output pulses at a same frequency as said input pulses in said periodic input signal.

4. The integrated circuit of claim 2, wherein said comparator generates a comparison signal having a third logic state when said first voltage exceeds said second voltage and a fourth logic state when said second voltage exceeds said first voltage; and said pulse generator begins generating said output pulse when said comparison signal transitions from said third logic state to said fourth logic state.

5. The integrated circuit of claim 2, wherein said pulse generator terminates said output pulse when said periodic input signal transitions from said second logic state to said first logic state.

6. The integrated circuit of claim 5, wherein said first and second charge storage devices are chosen such that said second voltage exceeds said first voltage at a point in time substantially equal to one-half a pulse width of said input pulse in said periodic input signal after said periodic input signal transitions from said first logic state to said second logic state.

7. The integrated circuit of claim 2, further comprising:

a power saving circuit disabling said comparator when said periodic input signal is said first logic state.

8. The integrated circuit of claim 7, wherein said power saving circuit disables said comparator after said pulse generator begins generating said output pulse.

9. The integrated circuit of claim 1, wherein said first and third logic states are logic high, and said second and fourth logic states are logic low.

10. The integrated circuit of claim 1, wherein said first and second pulse generating circuit further comprise:
 a first discharging circuit discharging said second charge storage device when said periodic input signal is said first logic state; and
 a second discharging circuit discharging said first charge storage device when said periodic input signal is said second logic state and said pulse generator is generating said output pulse.

11. The integrated circuit of claim 10, wherein said first and second pulse generating circuits further comprise:
 a discharging control circuit controlling said second discharging circuit to discharge said first charge storage device when said pulse generator fails to generate said output pulse and said periodic input signal is said second logic state.

12. The integrated circuit of claim 1, further comprising:
 an inverter inverting said periodic input signal, and outputting said inverted periodic input signal to said second pulse generating circuit.

13. The integrated circuit of claim 1, wherein said first and second charge storage devices are capacitors.

14. The integrated circuit of claim 10, wherein said first and second charge storage devices are sample and hold circuits.

15. The integrated circuit of claim 1, wherein said periodic input signal is a periodic digital signal.

16. A frequency doubling method, comprising:
 first generating a first pulse train based on a periodic input signal; and
 second generating a second pulse train based on said periodic input signal, said second pulse train being out of phase with said first pulse train;
 combining said first and second pulse trains to produce a periodic output signal having a frequency twice a frequency of said period input signal; and wherein
 said first and second generating steps each include the steps of,
  first charging a first charge storage device when said periodic input signal is a first logic state,
  second charging a second charge storage device when said periodic signal is a second logic state, said second charge storage device having half a storage capacity of said first charge storage device,
  comparing a first voltage stored by said first charge storage device to a second voltage stored by said second charge storage device, and
  third generating an output pulse having a pulse width half a pulse width of an input pulse in said periodic input signal based on output from said comparing step.

17. The method of claim 16, wherein said third generating step generates said output pulses at a same frequency as said input pulses in said periodic input signal.

18. The method of claim 16, wherein
 said comparing step generates a comparison signal having a third logic state when said first voltage exceeds said second voltage and a fourth logic state when said second voltage exceeds said first voltage; and
 said third generating step begins generating said output pulse when said comparison signal transitions from said third logic state to said fourth logic state.

19. The method of claim 16, wherein said third generating step terminates said output pulse when said periodic input signal transitions from said second logic state to said first logic state.

20. The method of claim 19, wherein said first and second charge storage devices are chosen such that said second voltage exceeds said first voltage at a point in time substantially equal to one-half a pulse width of said input pulse in said periodic input signal after said periodic input signal transitions from said first logic state to said second logic state.

21. The method of claim 16, further comprising:
 prohibiting performance of said comparing step when said periodic input signal is said first logic state.

22. The method of claim 21, wherein said prohibiting step prohibits performance of said comparing step after said third generating step begins generating said output pulse.

23. The method of claim 16, wherein said first and third logic states are logic high, and said second and fourth logic states are logic low.

24. The method of claim 16, wherein said first and second generating steps further comprise:
 first discharging said second charge storage device when said periodic input signal is said first logic state; and
 second discharging said first charge storage device when said periodic input signal is said second logic state and said third generating step is generating said output pulse.

25. The method of claim 24, wherein said first and second generating steps further comprise:
 controlling said second discharging step to discharge said first charge storage device when said third generating step fails to generate said output pulse and said periodic input signal is said second logic state.

26. The method of claim 16, further comprising:
 inverting said periodic input signal; and wherein
 said second generating step generates said second pulse train based on said inverted periodic input signal.

27. The method of claim 16, wherein said periodic input signal is a periodic digital signal.

* * * * *